United States Patent [19]

Celnik

[11] Patent Number: 4,617,729

[45] Date of Patent: Oct. 21, 1986

[54] PROCESS FOR MANUFACTURING MINIATURIZED ELECTRONIC POWER CIRCUITS

[75] Inventor: Jean Celnik, Paris, France

[73] Assignees: Automobiles Citroen, Neuilly Sur Seine; Automobiles Peugeot, Paris, both of France

[21] Appl. No.: 705,987

[22] Filed: Feb. 27, 1985

[30] Foreign Application Priority Data

Feb. 28, 1984 [FR] France .................... 84 03485

[51] Int. Cl.⁴ ............................................. H05K 3/34
[52] U.S. Cl. ....................................... 29/840; 29/589; 357/81; 427/96
[58] Field of Search .............. 29/825, 840, 577 C, 29/589; 427/96, 259; 357/80, 81

[56] References Cited

U.S. PATENT DOCUMENTS

| | | | |
|---|---|---|---|
| 3,439,255 | 4/1969 | Carnes et al. | 351/81 X |
| 3,492,586 | 1/1970 | Lettmann | 357/81 X |
| 3,899,379 | 8/1975 | Wanesky | 29/589 X |
| 4,352,120 | 9/1982 | Kurihara et al. | 357/81 |
| 4,412,377 | 11/1983 | Nagashima et al. | 29/840 X |
| 4,459,607 | 7/1984 | Reid | 357/81 X |
| 4,474,639 | 10/1984 | Fritz | 29/589 X |
| 4,480,779 | 11/1984 | Lue | 29/840 X |

FOREIGN PATENT DOCUMENTS 1536471 12/1978 United Kingdom ................ 29/825

*Primary Examiner*—Howard N. Goldberg
*Assistant Examiner*—Carl J. Arbes
*Attorney, Agent, or Firm*—Karl F. Ross; Herbert Dubno

[57] ABSTRACT

Process for manufacturing miniaturized electronic power circuits comprising power elements soldered to a conducting network with interpositioning of an insulating layer on a good heat conducting metal plate. A substrate is formed by depositing on the metal plate an insulating layer coated outwardly with a good conducting metal layer, and conducting networks are formed from this metal layer, hard soldering paste being deposited at the positions of the connections to be hard soldered to the terminals of the components as well as at the positions where the bodies of the components are to be hard soldered to the layer, the components being laid flat on the substrate so that the terminals are in contact with the hard soldering paste, and are hard soldered in the vapor phase, the circuit obtained then being placed in a sealed case.

7 Claims, 4 Drawing Figures

PROCESS FOR MANUFACTURING MINIATURIZED ELECTRONIC POWER CIRCUITS

FIELD OF THE INVENTION

The present invention relates to a process for manufacturing miniaturized electronic power circuits formed by so called SMI (insulated metal substrate) technological procedures and the miniaturized circuits obtained by this process.

BACKGROUND OF THE INVENTION

It is important, in the manufacture of miniaturized electronic power circuits, to provide good heat dissipation of the module and, more especially, of the power elements of the module when they are applied flat.

Experience has shown that the processes known up to the present for manufacturing circuits comprising power elements applied flat on the conducting network do not allow soldering under the components, and therefore the flat application of mini power cases in a satisfactory way.

OBJECT OF THE INVENTION

It is an object of the present invention therefore to provide a manufacturing process which overcomes these disadvantages and allows miniaturized power circuits to be constructed, comprising mini power elements applied flat on the conducting network and in contact therewith by applying solder under the component, which improves the heat exchange by integration of the heat-sink in the interconnection substrate and ensures heat dissipation of the module, these power circuits then being fitted in an intermediate heat-sink directly on the chassis.

SUMMARY OF THE INVENTION

The process of the invention in which the mini power elements are hard soldered to a conducting network with interpositioning of an insulating means on a good heat conducting metal plate, comprises forming a substrate by bonding to the metal plate a laminated foil formed by a plastic film coated on the outside with a good conducting metal layer, the conducting network being formed by a metal layer, a hard soldering paste being laid at the positions of the to be soldered to the terminals of the components, as well as at the positions on the metal layer where the bodies of the flatly applied components are to be hard soldered to this layer, the components being positioned on the substrate so that their terminals are in contact with the hard soldering paste and are hard soldered in a vapor phase, the circuit obtained then being placed in a sealed case.

In an advantageous embodiment of the invention, a substrate is formed whose area is a multiple of that of the circuit to be formed, and a series of identical circuits are formed on the substrate and then the assembly is cut up so as to obtain unit circuits.

Apart from the advantages already pointed out, with the process of the invention considerable miniaturization and better heat conductivity may be obtained and the reliability may be improved by a better reproductivity of the procedure, the use of modern components and the introduction into the manufacture of automatic control phases.

Finally, it lowers the unit prices by collective treatment of the product.

BRIEF DESCRIPTION OF THE DRAWING

One embodiment of the method or process of the invention will be described hereafter by way of a non limitative example, with reference to the accompanying drawing in which.

SPECIFIC DESCRIPTION

Figure 1:
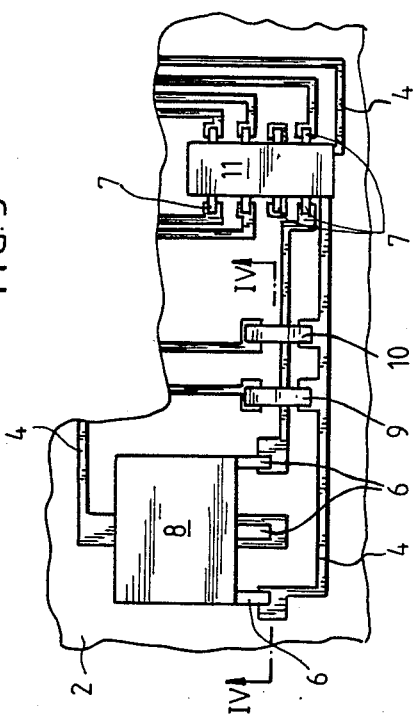
FIG. 1 shows a part of a substrate after etching of the conducting network.
Figure 2:
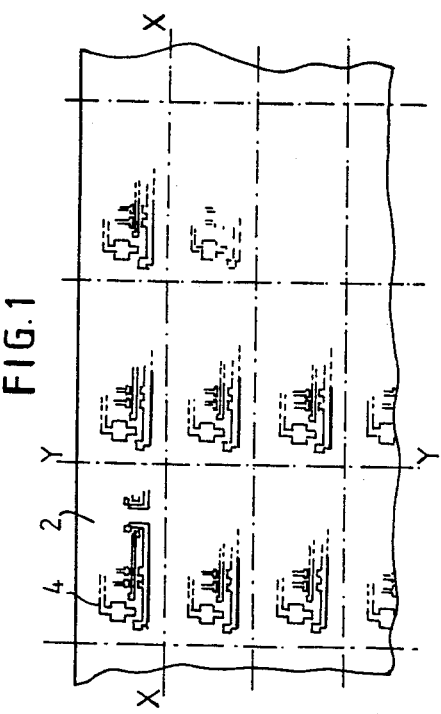
FIG. 2, shows on a larger scale a portion of the substrate of FIG. 1.
Figure 4:
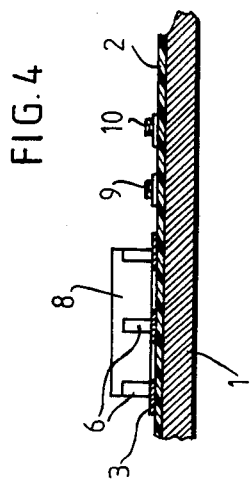
FIG. 4 is a sectional view of the substrate along line IV—IV of FIG. 3.
Figure 3:
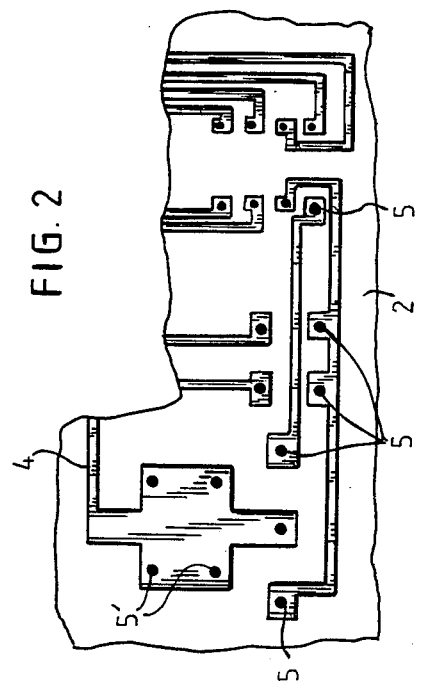
FIG. 3 is a view similar to FIG. 2, after positioning and hard soldering of the components.

According to the invention, in order to form a miniaturized power circuit, a substrate is provided formed by a plate 1 made from a highly conductive metal, for example aluminium, on which is bonded a laminate foil formed from a plastic film 2 coated on the outwardly facing surface with another highly conductive metal layer 3. Plate 1 has a thickness on the order of 2 to 3 mm. The plastic film has a small thickness on the order of 25 to 30, preferably 25 to 50 microns and is formed for example from a high temperature resistant polyimide resin, such as the one known commercially under the name of Kapton. As far as the layer 3 is concerned, it can be formed by a copper layer deposited on the plastic film and having a thickness on the order of 35 to 70 microns. The laminate foil is fixed to the plate 1 by hot bonding.

A series of circuits are formed simultaneously on the substrate. The different conducting networks, such as shown at 4, are formed from layer 3 by only leaving the required parts of this layer. The layer 3 may for example, be coated with a photosensitive film, exposed through a mask representing the conducting networks to be formed, washed so as to remove the unexposed parts, and leaving the bared copper etched; it then only remains to remove the photosensitive film from the exposed parts which covers the networks 4.

Then the hard-soldering paste is deposited by silk screen printing at the positions such as 5 of networks 4 which are to be hard soldered to connections of the components as well as at the positions such as 5' where a power element is to be hard soldered to the substrate so as to ensure that the transfer of the heat therefrom is released from plate 1 serving as a heat-sink.

The components are laid flat on the substrate so that their lugs or connecting wires such as 6 and 7 are in contact with the points 5 of hard-soldering paste and the cases of the power elements are in direct contact with the metal layer 3 of the laminate foil (grounded). These components may for example be power transistors such as 8, resistors or diodes such as 9 and 10, or integrated circuits such as 11. They are laid automatically for example using a machine of the "pick and place" type adapted for laying 5000 to 10,000 components per hour or using a machine of the "multiplace" type which allows collective and automatic laying of 30,000 to 50,000 components per hour.

Then the lugs 6 and 7 of the components on networks 4 are hard soldered in the vapor phase and cleaned. For that, the substrate with the components is immersed in a fluid in the vapor state, for example in a fluorinated organic compound, such as is manufactured by the 3M Company. The vaporization temperature of the fluid determines the type of hard solder and must be greater by 20° C. than the melting temperature of the hard solder so that this latter has good fluidity and wetability characteristics.

The vapor prevents the hard soldering from being exposed to the air and limits the risks of oxidization during this phase while allowing alloys to be used formed from 60% tin and 40% lead with a melting temperature of 185° C.

This operation also allows hard soldering to be performed under the components, i.e. in the case of power components, hard soldering to be performed between the heat sink situated under the component and the substrate.

Then electric tests are carried out for each function of the circuit by means of an automatic machine.

It only remains to cut out the different circuits along the lines such as X—X and Y—Y in FIG. 1, such cutting out being effected using a cutting out press or by laser etc, as required, to put each of the separate circuits in a plastic case obtained by injection of plastic material in a mold, forming the output connector and the fixing points of the case, and to hard solder the output connections.

It goes without saying that the present invention is not to be considered as limited to the embodiment described and shown but covers, on the contrary, all variants thereof.

I claim:

1. A process for manufacturing a miniaturized electronic power circuit including power elements and other components soldered to a conducting network with the interposition of an insulator between said network and a heat conducting plate forming a heat sink, comprising the steps of:

(a) coating a plastic film on one side with a highly conductive metal layer to form a laminate foil therewith;

(b) bonding said laminate foil to said plate on an opposite uncoated side of said plastic film to form a substrate consisting of said foil and said plate;

(c) forming said conducting network from said metal layer;

(d) depositing soldering paste at selected locations of said network;

(e) placing said components flatly on the foil of said substrate with terminals thereof in registration with certain of said locations;

(f) placing said power elements flatly on the foil of said substrate with bodies of said power elements in registration with other of said locations and terminals of said power elements in registration with said certain of said locations;

(g) hard soldering said components and said power elements at said locations in a vapor phase to said network; and (h) placing the resulting circuit in a sealed case.

2. The process defined in claim 1, further comprising the steps of forming a plurality of said circuits on said substrate, and selectively severing said substrate to form a plurality of unit circuits.

3. The process defined in claim 1 wherein said plastic film is a high temperature resin resistant to temperature on the order of 150° C.

4. The process defined in claim 1 wherein said plastic film has a thickness on the order of 25 to 50 microns and said metal layer is formed of copper having a thickness on the order of 35 to 70 microns.

5. The process defined in claim 1 wherein said conducting network is formed by chemical etching of said metal layer.

6. The process defined in claim 1 wherein the vapor phase hard soldering step is carried out with said components and power elements supported on said substrate being immersed in a vapor of a fluorinated organic compound having a temperature about 20° C. greater than the melting temperature of the hard solder.

7. The process defined in claim 2, comprising the further step of automatically testing each circuit of said plurality of said circuits prior to severing said substrate.

* * * * *